US009502497B2

(12) United States Patent
Wang et al.

(10) Patent No.: US 9,502,497 B2
(45) Date of Patent: Nov. 22, 2016

(54) METHOD FOR PREPARING POWER DIODE

(71) Applicant: CSMC TECHNOLOGIES FAB1 CO., LTD., Wuxi New District (CN)

(72) Inventors: Genyi Wang, Wuxi New District (CN); Xiaoshe Deng, Wuxi New District (CN); Shengrong Zong, Wuxi New District (CN); Dongfei Zhou, Wuxi New District (CN)

(73) Assignee: CSMC Technologies Fab1 Co., Ltd., Wuxi New District, Jiangsu (CN)

( * ) Notice: Subject to any disclaimer, the term of this patent is extended or adjusted under 35 U.S.C. 154(b) by 0 days.

(21) Appl. No.: 14/902,270

(22) PCT Filed: Oct. 22, 2014

(86) PCT No.: PCT/CN2014/089159
§ 371 (c)(1),
(2) Date: Dec. 30, 2015

(87) PCT Pub. No.: WO2015/058691
PCT Pub. Date: Apr. 30, 2015

(65) Prior Publication Data
US 2016/0307994 A1 Oct. 20, 2016

(30) Foreign Application Priority Data
Oct. 23, 2013 (CN) .......................... 2013 1 0503657

(51) Int. Cl.
*H01L 29/00* (2006.01)
*H01L 29/06* (2006.01)
*H01L 29/66* (2006.01)
*H01L 21/266* (2006.01)
*H01L 21/265* (2006.01)
(Continued)

(52) U.S. Cl.
CPC ....... *H01L 29/0619* (2013.01); *H01L 21/0273* (2013.01); *H01L 21/266* (2013.01);
(Continued)

(58) Field of Classification Search
CPC .................. H01L 21/31116; H01L 21/32137; H01L 21/32105; H01L 21/0273; H01L 21/26513; H01L 21/266; H01L 21/324; H01L 29/66325; H01L 29/6633; H01L 29/0619; H01L 29/1095; H01L 29/66136
See application file for complete search history.

(56) References Cited

U.S. PATENT DOCUMENTS 8,471,267 B2 * 6/2013 Hayashi ................ H01L 21/045
257/77
9,252,240 B2 * 2/2016 Xu ..................... H01L 21/76213
(Continued)

FOREIGN PATENT DOCUMENTS

| CN | 101752208 | 6/2010 |
|---|---|---|
| CN | 101859703 | 10/2010 |
| CN | 102217070 | 10/2011 |

OTHER PUBLICATIONS

International Search Report of PCT/CN2014/089159, dated Dec. 16, 2014, and English translation thereof, 4 pages total.

*Primary Examiner* — Kimberly Rizkallah
*Assistant Examiner* — Alexander Belousov
(74) *Attorney, Agent, or Firm* — Hamre, Schumann, Mueller & Larson, P.C.

(57) ABSTRACT

A method for preparing a power diode, including: providing a substrate (10), growing a N type layer (20) on the front surface of the substrate (10); forming a terminal protecting ring; forming an oxide layer (30), knot-pushing to the terminal protecting ring; forming a gate oxide layer (60), depositing a poly-silicon layer (70) on the gate oxide layer (60); depositing a $SiO_2$ layer (80) on the surface of the poly-silicon layer (70) and a oxide layer (50); forming a N type heavy doped region (92); forming a P+ region; removing a photoresist, implanting P type ions using the $SiO_2$ layer (80) as a mask layer, and forming a P type body region; heat annealing; forming a side wall structure in the opening of the poly-silicon layer (70), the gate oxide layer (60) being etched, and removing the $SiO_2$ layer (80); and processing a front surface metallization and a back surface metallization treatment. According to the method for preparing the power diode, by adjusting the isotropy etching level of the $SiO_2$ layer and the ion implanting dose and energy, the threshold voltage of a DMOS structure can be adjusted, and the adjustment of the forward voltage drop for the device can be achieved.

10 Claims, 7 Drawing Sheets

(51) Int. Cl.
  *H01L 21/311* (2006.01)
  *H01L 21/324* (2006.01)
  *H01L 21/027* (2006.01)
  *H01L 29/10* (2006.01)
  *H01L 21/321* (2006.01)
  *H01L 21/3213* (2006.01)

(52) U.S. Cl.
  CPC ... *H01L21/26513* (2013.01); *H01L 21/31116* (2013.01); *H01L 21/324* (2013.01); *H01L 29/1095* (2013.01); *H01L 29/66136* (2013.01); *H01L 21/32105* (2013.01); *H01L 21/32137* (2013.01); *H01L 29/66325* (2013.01); *H01L 29/66333* (2013.01)

(56) References Cited

U.S. PATENT DOCUMENTS

| | | | |
|---|---|---|---|
| 9,443,926 B2* | 9/2016 | Zhang | H01L 29/66333 |
| 2003/0222290 A1* | 12/2003 | Rodov | H01L 29/1095 257/282 |
| 2011/0220917 A1* | 9/2011 | Hayashi | H01L 21/045 257/77 |
| 2013/0037878 A1* | 2/2013 | Wang | H01L 29/0634 257/329 |
| 2013/0119394 A1* | 5/2013 | Zhu | H01L 29/872 257/76 |
| 2014/0054680 A1* | 2/2014 | Hashimoto | H01L 21/3242 257/329 |

* cited by examiner

METHOD FOR PREPARING POWER DIODE

FIELD OF THE INVENTION

The present invention relates to a field of semiconductor device manufacturing technique, particularly relates to a method of manufacturing a power diode.

BACKGROUND OF THE INVENTION

Diodes are widely used electronic power devices, and requirements of producing and applying processes of the diodes are progressively increasing. Power consumption of the diode is greatly affected by a conduction voltage drop of the diode, thus, it is important to reduce the conduction voltage drop of the diode.

SUMMARY OF THE INVENTION

Accordingly, it is necessary to provide a method of manufacturing a power diode with low forward conduction voltage drop.

A method of manufacturing a power diode includes the following steps: providing a substrate, and growing an N-type layer on a front side of the substrate; forming a terminal guard ring on a front side of the N-type layer; forming an oxide layer on a surface of the front side of the N-type layer, and performing a driving-in to the terminal guard ring; performing photoetching by using an active region photomask, and etching the oxide layer on an active region area; after removing a photoresist, forming a gate oxide layer on the front side of the N-type layer on the active region area, and depositing a polysilicon layer on the gate oxide layer; depositing a $SiO_2$ layer on a surface of the polysilicon layer and a surface of the oxide layer; performing photoetching by using a polysilicon photomask, etching the $SiO_2$ layer, and then etching the polysilicon layer; implanting N-type ions into the etched area through self-aligned implantation, and forming an N-type heavily doped region below the gate oxide layer; performing a gate oxide layer etching and a silicon etching by using the photoresist as a masking layer, implanting P-type ions below the etched area via ion implantation, and forming a P+ region; removing the photoresist, implanting P-type ions by using the $SiO_2$ layer as a masking layer, and forming a P-type body region; performing thermal annealing, and activating the implanted impurities; forming a side wall structure at an opening etched on the polysilicon layer and the gate oxide layer, and removing the $SiO_2$ layer; and performing a front side metallization processing and a back side metallization processing.

In one of embodiments, in the performing photoetching by using the polysilicon photomask, etching the $SiO_2$ layer, and then etching the polysilicon layer; implanting the N-type ions into the etched area through self-aligned implantation, and forming the N-type heavily doped region below the gate oxide layer, the etching of the $SiO_2$ layer is isotropic etching, and the etching of the polysilicon layer is anisotropic etching.

In one of embodiments, the forming the side wall structure at the opening etched on the polysilicon layer and the gate oxide layer, and removing the $SiO_2$ layer includes: coating the photoresist on the front side of the wafer, forming the side wall structure at the opening etched on the polysilicon layer and the gate oxide layer through back etching, and then etching and removing the $SiO_2$ layer.

In one of embodiments, the forming the terminal guard ring on the front side of the N-type layer includes: forming a thin pad oxide layer on a surface of the front side of the N-type layer, performing photoetching by using a terminal guard ring photomask, implanting P-type ions into the N-type layer by using the photoresist as the masking layer, and forming a P-type terminal guard ring below the thin pad oxide layer.

In one of embodiments, in the performing the gate oxide layer etching and the silicon etching by using the photoresist as the masking layer, implanting P-type ions below the etched area via ion implantation, and forming the P+ region, a thickness of the removed by etching silicon is 0.15 μm to 0.3 μm.

In one of embodiments, in the performing photoetching by using the polysilicon photomask, etching the $SiO_2$ layer, and then etching the polysilicon layer; implanting the N-type ions into the etched area through self-aligned implantation, and forming the N-type heavily doped region below the gate oxide layer, the N-type ions are As ions; in the performing the gate oxide layer etching and the silicon etching by using the photoresist as the masking layer, implanting P-type ions below the etched area via ion implantation, and forming the P+ region, the P-type ions include boron ions and $BF_2$ ions; and in the removing the photoresist, implanting P-type ions by using the $SiO_2$ layer as a masking layer, and forming the P-type body region, the P-type ions are boron ions.

In one of embodiments, in the performing photoetching by using the polysilicon photomask, etching the $SiO_2$ layer, and then etching the polysilicon layer; implanting the N-type ions into the etched area through self-aligned implantation, and forming the N-type heavily doped region below the gate oxide layer, an implantation energy of the As ions is 30 KeV to 50 KeV, and a sum of implantation dose of the As ions is $1 \times 10^{15}$ cm$^{-2}$ to $1 \times 10^{16}$ cm$^{-2}$; in the performing the gate oxide layer etching and the silicon etching by using the photoresist as the masking layer, implanting P-type ions below the etched area via ion implantation, and forming the P+ region, a sum of implantation dose of the boron ions is $1 \times 10^{13}$ cm$^{-2}$ to $5 \times 10^{13}$ cm$^{-2}$, and an implantation energy of the boron ions is 80 KeV to 100 KeV, while an implantation energy of the $BF_2$ ions is 20 KeV to 40 KeV, and a sum of implantation dose of the $BF_2$ ions is $6 \times 10^{14}$ cm$^{-2}$ to $1 \times 10^{15}$ cm$^{-2}$; and in the removing the photoresist, implanting P-type ions by using the $SiO_2$ layer as a masking layer, and forming the P-type body region, an implantation energy of the boron ions is 30 KeV to 50 KeV, and a sum of implantation dose of the boron ions is $1 \times 10^{13}$ cm$^{-2}$ to $5 \times 10^{13}$ cm$^{-2}$.

In one of embodiments, in the performing the gate oxide layer etching and the silicon etching by using the photoresist as the masking layer, implanting P-type ions below the etched area via ion implantation, and forming the P+ region, the P-type ions are implanted in plural steps.

In one of embodiments, the driving-in is performed in an oxygen-free environment at a temperature of less than or equal to 1100° C., and a driving-in time is 60 minutes to 200 minutes.

In one of embodiments, tin the depositing the $SiO_2$ layer on the surface of the polysilicon layer and the surface of the oxide layer, the depositing is a low voltage chemical vapor deposition using ethyl silicate as a reaction agent.

In the method of manufacturing the power diode described above, a threshold voltage of a DMOS structure can be adjusted through adjusting an extent of the isotropic etching of the $SiO_2$ layer and the implantation dose and the implantation energy of the ions, and thus achieving an adjustment of forward voltage drop of the device. After forming the P-type body region, the deposited $SiO_2$ layer is removed to increase a contact area between metal and the polysilicon, thus reducing a thermal resistance. In addition, the accumulation of electrons below the polysilicon is promoted, further reducing the forward conduction voltage drop of the device. Furthermore, a P well photomask and a corresponding photoetching process can be omitted, and thus the cost is saved.

DETAILED DESCRIPTION OF THE EMBODIMENTS

The details of one or more embodiments of the invention are set forth in the accompanying drawings and the description below. Other features, objects, and advantages of the invention will be apparent from the description and drawings.

Figure 1:
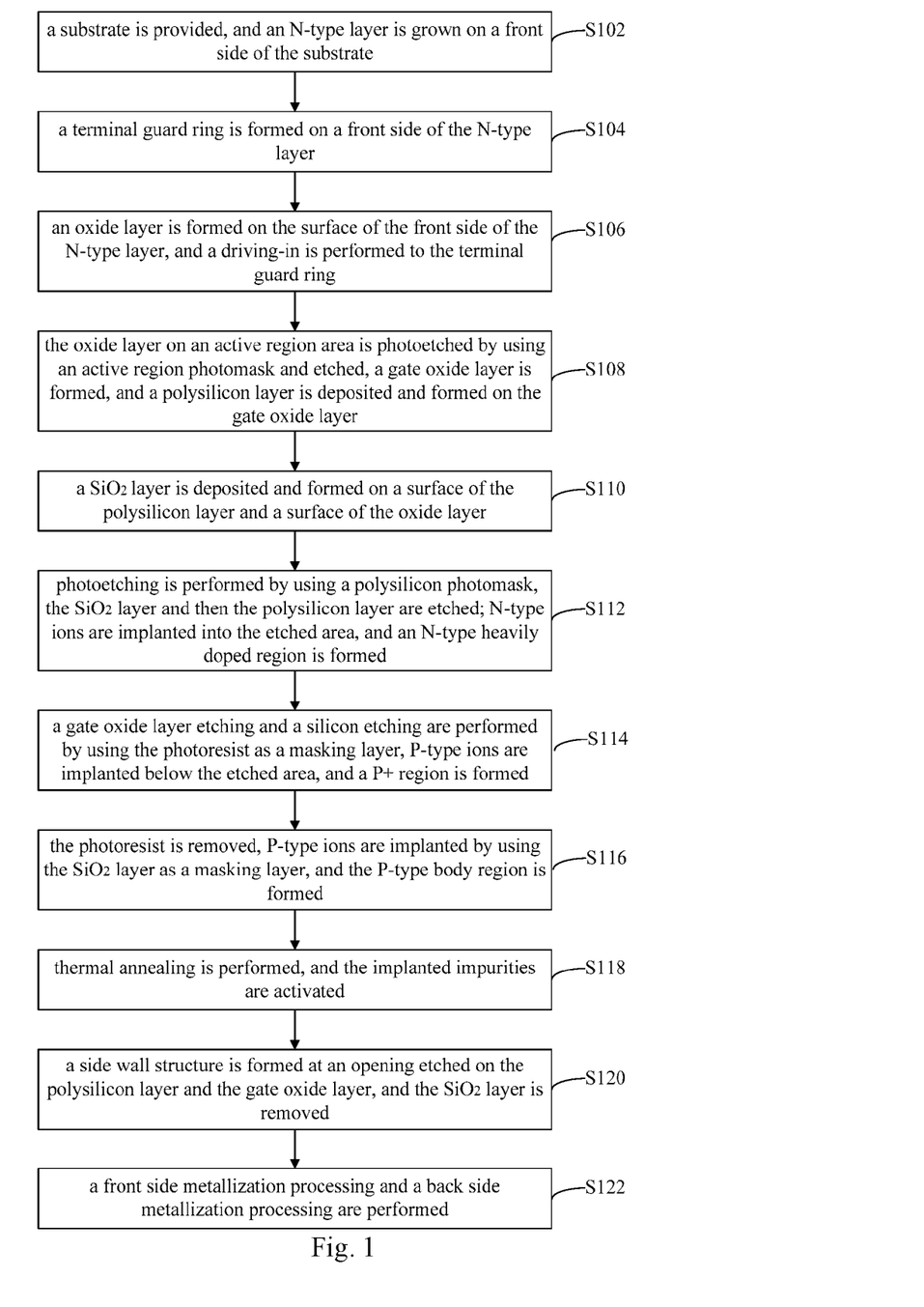
FIG. 1 is a flow chart of a method of manufacturing a power diode in accordance with one embodiment.

FIG. 1 is a flow chart of a method of manufacturing a power diode in accordance with one embodiment, which includes the following steps:

In step S102, a substrate is provided, and an N-type layer is grown on a front side of the substrate.

Figure 2:
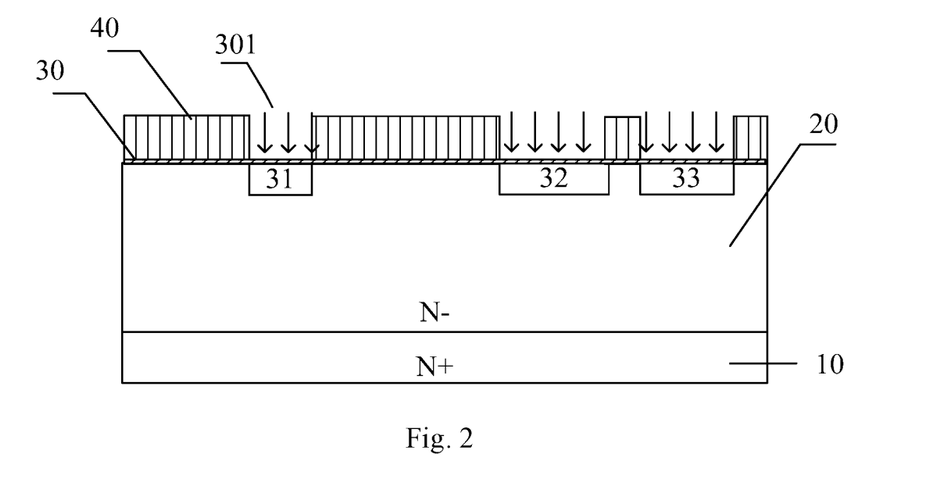
FIGS. 2 to 10 are partial cross-section views of the power diode during manufacturing by using the method of manufacturing the power diode in accordance with one embodiment.

Referring also to FIG. 2, the substrate 10 is made of semiconductor materials such as silicon, silicon carbide, gallium arsenide, indium phosphide or silicon germanium. In the illustrated embodiment, the substrate 10 is made of an N-type silicon wafer with an orientation of <100>.

In the illustrated embodiment, the N-type layer 20 with a certain thickness and resistivity is epitaxially grown on the front side (a surface forming a frontal structure of the power diode) of the substrate 10. A thickness of the N-type layer is 3 μm to 20 μm, and the resistivity is 0.5 Ω·cm to 10 Ω·cm. The thickness of the N-type layer 20 is set according to a voltage demand of the power diode being manufactured, in an embodiment, if the power diode is a device with 100V withstand voltage, the thickness of the power diode will be 10 μm, and the resistivity will be 2 Ω·cm.

In step S104, a terminal guard ring is formed on a front side of the N-type layer.

A thin pad oxide layer 30 is formed on a surface of the front side of the N-type layer 20. Then photoetching is performed by using a terminal guard ring photomask, implanting P-type ions by using a photoresist 40 as a masking layer, and forming a P-type terminal guard ring below the thin pad oxide layer 30. FIG. 2 shows three terminal guard rings 31, 32, and 33, the terminal guard ring 31 is located at an active region area, and the terminal guard ring 32 is partly located at the active region area. In other embodiments, the amount of the terminal guard rings is not limited to the amount of the illustrated embodiment, being able to be selected and arranged according to actual requirement of the device.

In the illustrated embodiment, the implanted P-type ions are boron ions, an implantation energy of the boron ions is 50 KeV to 80 KeV, and a sum of implantation dose of the boron ions is $1\times10^{13}$ $cm^{-2}$ to $1\times10^{14}$ $cm^{-2}$. In other embodiments, the boron ions can be replaced by other P-type ions. FIG. 2 is a partial cross-section view of the power diode after finishing step S104.

In step S106, an oxide layer is formed on the surface of the front side of the N-type layer, and a driving-in is performed to the terminal guard ring.

Figure 3:
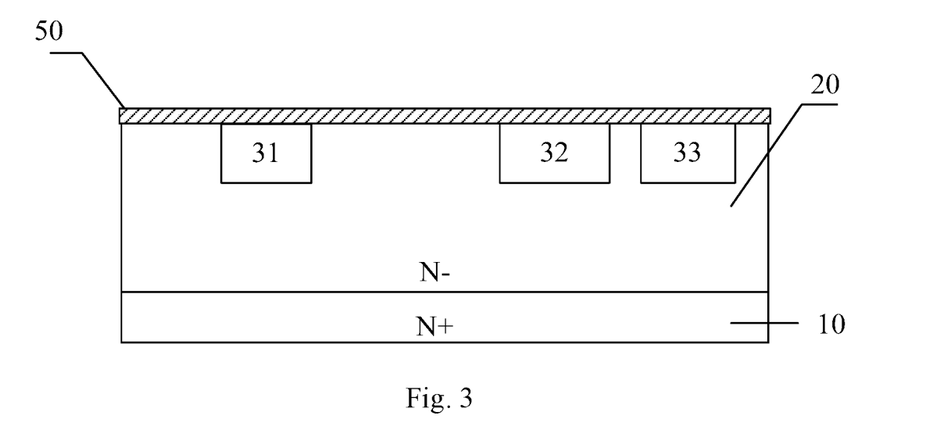

Referring also to FIG. 3, after removing the photoresist 40, the oxide layer 50 with a thickness of 1000 angstrom to 5000 angstrom is deposited and formed on the front side of the N-type layer 20, and the driving-in is performed to the terminal guard ring. FIG. 3 is a partial cross-section view of the power diode after finishing step S106. In the illustrated embodiment, the driving-in is performed in an oxygen-free environment at a temperature of less than or equal to 1100° C., and a driving-in time is 60 minutes to 200 minutes. In order to save the cost, in other embodiments, this step of forming the oxide layer 50 and driving-in can be combined to a thermal process of aerobic driving-in.

In step S108, the oxide layer on an active region area is photoetched by using an active region photomask and etched, a gate oxide layer is formed, and a polysilicon layer is deposited and formed on the gate oxide layer.

Figure 4:
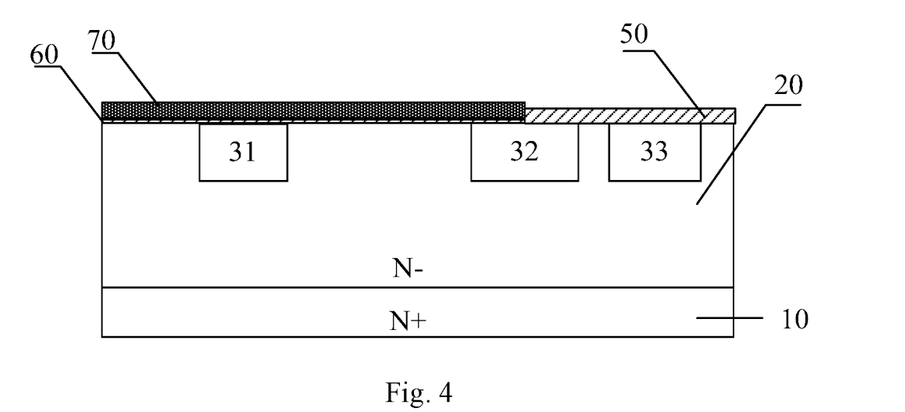

The active region is etched by using the active region photomask on the area for manufacturing the device. After etching the oxide layer 50 on the active region area, the photoresist is removed, and the gate oxide layer 60 is formed via thermal growth. In the illustrated embodiment, a thickness of the gate oxide layer 60 is 20 angstrom to 100 angstrom, and a thickness of the formed polysilicon layer 70 is 800 angstrom to 6000 angstrom. In other embodiments, thicknesses of the gate oxide layer 60 and the polysilicon layer 70 can be determined according to actual requirements. By adjusting the thickness of the polysilicon layer 70, the distribution of the impurities in the doped region can be adjusted, so as to reduce the forward voltage drop Vf of the device. FIG. 4 is a partial cross-section view of the power diode after finishing step S108.

In step S110, a $SiO_2$ layer is deposited and formed on a surface of the polysilicon layer and a surface of the oxide layer.

Figure 5:
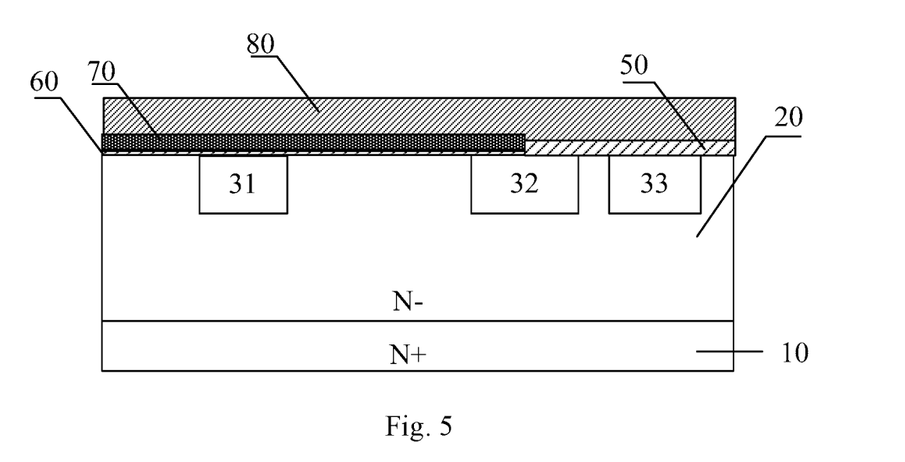

Referring also to FIG. 5, the $SiO_2$ layer 80 is deposited and formed on the front surface of the polysilicon layer 70 and the oxide layer 50 through a low voltage chemical vapor deposition (LPCVD) by using tetraethoxysilane (TEOS) as a reaction agent. A thickness of the $SiO_2$ layer 80 can be selected according to actual requirements. FIG. 5 is a partial cross-section view of the power diode after finishing step S110.

In step S112, photoetching is performed by using a polysilicon photomask, the $SiO_2$ layer and then the polysilicon layer are etched; N-type ions are implanted into the etched area, and an N-type heavily doped region is formed.

Figure 6:
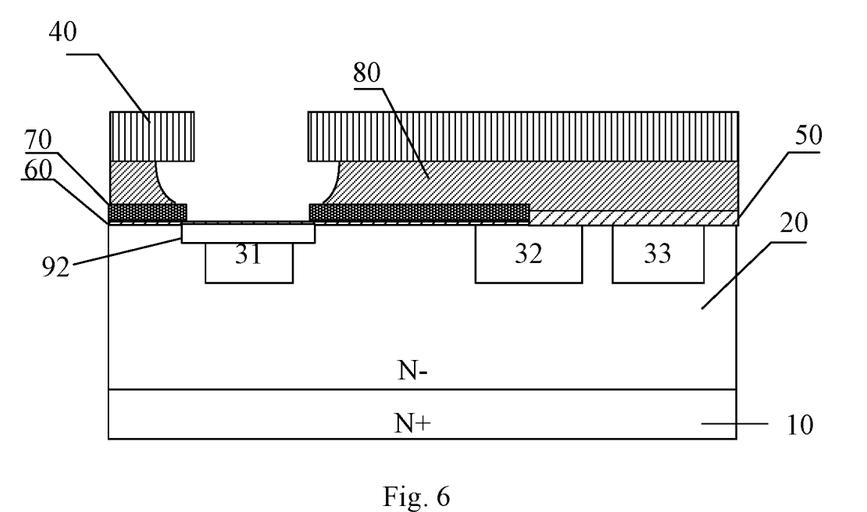

Photoetching is performed by using the polysilicon photomask, the $SiO_2$ layer 80 and then the polysilicon layer 70 are etched, a polysilicon gate is formed and a photoetching window is exposed. In the illustrated embodiment, the etching of the polysilicon layer 70 is anisotropic etching, and the etching of the $SiO_2$ layer 80 is isotropic etching, so the etched opening of the $SiO_2$ layer 80 is a bowl-shaped structure. N-type ions are implanted into the etched area via self-aligned implantation through the photoetching window, and the N-type heavily doped region 92 is formed, the photoresist is transitorily held. The implanted N-type ions are As ions, an implantation energy of the As ions is 30 KeV to 50 KeV, and a sum of implantation dose of the As ions is $1\times10^{15}$ $cm^{-2}$ to $1\times10^{16}$ $cm^{-2}$. By adjusting the threshold voltage of the DMOS structure through adjusting a level of the isotropic etching of the SiO$_2$ layer 80 and the implantation dose and the implantation energy of the ions, an adjustment of forward voltage drop of the device is achieved. FIG. 6 is a partial cross-section view of the power diode after finishing step S112.

In step S114, a gate oxide layer etching and a silicon etching are performed by using the photoresist as a masking layer, P-type ions are implanted below the etched area, and a P+ region is formed.

Figure 7:
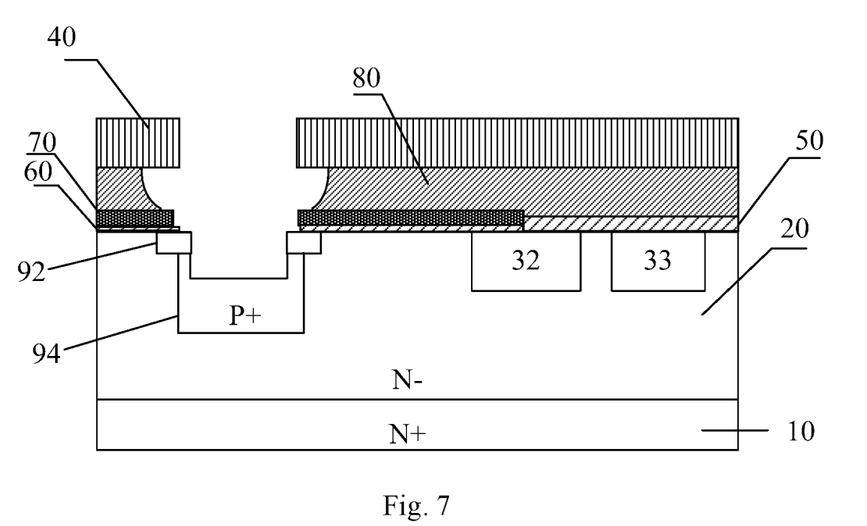

Referring also to FIG. 7, the polysilicon photoresist 40 is used as the masking layer, the gate oxide layer 60 and then silicon are etched, P-type ions are implanted below the etched area in plural steps, and a deep P+ region 94 is formed.

In the illustrated embodiment, during etching the silicon, a thickness of the removed by etching silicon is 0.15 μm to 0.3 μm, forming a shallow slot structure, so as to obtain better impurity distribution and larger metal contact area, and improve the performance of the device. The implanted P-type ions include boron ions and BF$_2$ ions. The boron ions are implanted in four steps, an implantation energy of the boron ions is 80 KeV to 100 KeV, and a sum of implantation dose of the boron ions is $1\times10^{13}$ cm$^{-2}$ to $5\times10^{13}$ cm$^{-2}$. An implantation energy of the BF$_2$ ions is 20 KeV to 40 KeV, and a sum of implantation dose of the BF$_2$ ions is $6\times10^{14}$ cm$^{-2}$ to $1\times10^{15}$ cm$^{-2}$. By implanting in plural steps, a favorable impurity distribution is obtained, reverse recovery time is reduced, and switching performance of the device is improved. FIG. 7 is a partial cross-section view of the power diode after finishing step S114.

In step S116, the photoresist is removed, P-type ions are implanted by using the SiO$_2$ layer as a masking layer, and the P-type body region is formed.

Figure 8:
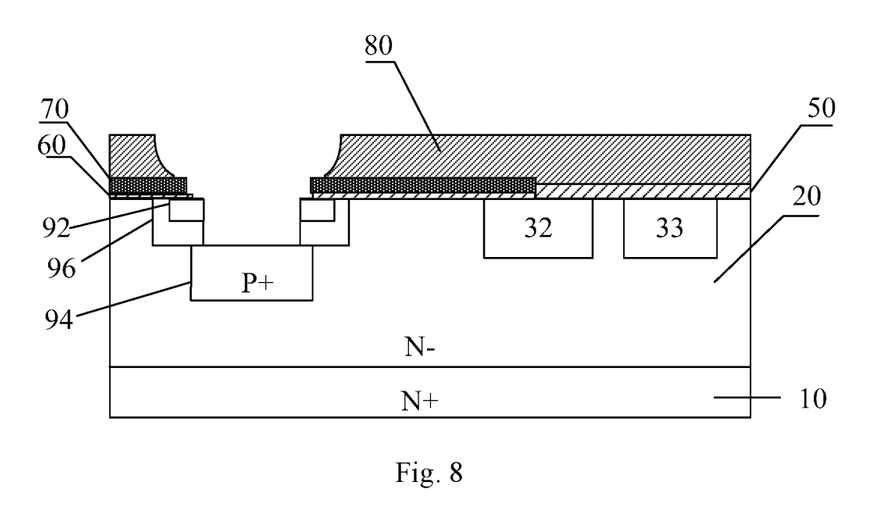

Referring also to FIG. 8, the photoresist is removed, P-type ions are implanted by using the SiO$_2$ layer 80 as the masking layer, and the P-type body region is formed to be used as a MOS channel. In the illustrated embodiment, the implanted P-type ions are boron ions, an implantation energy of the boron ions is 30 KeV to 50 KeV, and a sum of implantation dose of the boron ions is $1\times10^{13}$ to $5\times10^{13}$ cm$^{-2}$. Implanting the P-type ions by using the SiO$_2$ layer 80 as the masking layer can omit a process of photomask, simplify the process and reduce the manufacturing cost. FIG. 8 is a partial cross-section view of the power diode after finishing step S116.

In step S118, thermal annealing is performed, and the implanted impurities are activated.

In the illustrated embodiment, the three doping layers, the N-type heavily doped region 92, the P+ region 94 and the P-type body region 96 are rapidly thermal annealed, and the implanted impurities are activated. Only one thermal annealing process is used to complete the activating of the impurity in these three doping layers, the process is simplified and the cost is reduced without affecting the performance of the product. In other embodiments, a rapidly thermal annealing can be performed after every implantation.

In step S120, a side wall structure is formed at an opening etched on the polysilicon layer and the gate oxide layer, and the SiO$_2$ layer is removed.

Figure 9:
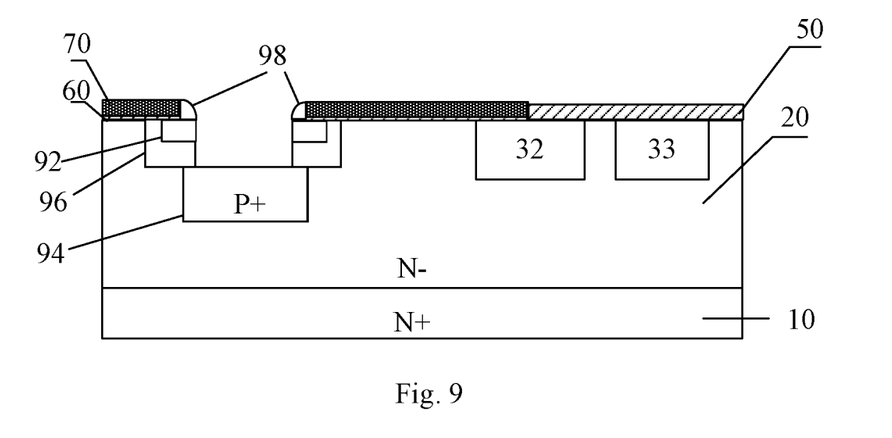

Referring also to FIG. 9, the photoresist is coated on a front side of a wafer, the side wall structure 98 is formed at the opening etched on the polysilicon layer 70 and the gate oxide layer 60 through back etching. The side wall structure 98 can protect the polysilicon layer 70 and the gate oxide layer 60, so as to remove the SiO$_2$ layer 80. The SiO$_2$ layer 80 can be removed by wet etching or dry etching By removing the SiO$_2$ layer 80 formed by low voltage gas phase chemical deposition, the contact area of metal and the polysilicon is increased, and the thermal resistance is reduced. In addition, the accumulation of electrons under the poly silicon is promoted and thus the forward conduction voltage drop is reduced. FIG. 9 is a partial cross-section view of the power diode after finishing step S120.

In step S122, a front side metallization processing and a back side metallization processing are performed.

Figure 10:
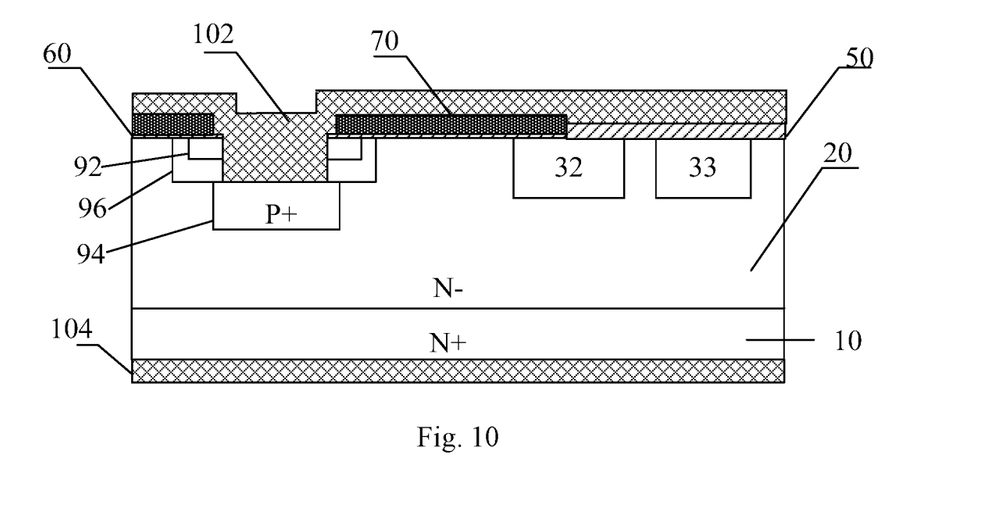

Referring also to FIG. 10, photoresist removing, oxide layer etching, and then conductive metal sputtering are performed on the whole surface of the device. During removing the photoresist from the whole surface of the device, the side wall structure 98 is also removed. The conductive metal is etched by using a metal photomask, a metal wire layer 102 is formed, and the metallization of the front side is completed.

The back side of the surface 10 is ground to a required thickness, the conductive metal is sputtered on the back side of the substrate 10 and a back side metal wire layer 104 is formed, and the metallization of the back side is completed. During the metallization of the front side and the metallization of the back side, the metal being sputtered includes aluminum, titanium, nickel, silver, copper, etc. FIG. 10 is a partial cross-section view of the power diode after finishing step S122.

Four photomasks, namely the terminal guard ring photomask, the active region photomask, the polysilicon photomask and the metal photomask are used in the above manufacturing process, which omits one photomask comparing to the conventional manufacturing process, simplifies the process and reduces the cost. The process of the above method of manufacturing a power diode is completely compatible with that of a Double-diffused MOSFET (DMOS), having the advantages of universality and good transferability on different IC production line.

According to the method of manufacturing the power diode described above, after manufacturing the N-type heavily doped region and the P+ region, the SiO$_2$ layer 80 formed by low voltage gas phase chemical deposition and then etched through isotropic etching; the P-type ions are implanted below the etched area, the manufacturing of the P-type body region is completed, and the MOS channel is formed; at last, the SiO$_2$ layer 80 is removed, and the front side metallization and front side metallization are completed. A threshold voltage of the DMOS structure can be adjusted through adjusting an extent of the isotropic etching of the SiO$_2$ layer and the implantation dose and the implantation energy of the ions, and thus achieving the adjustment of forward voltage drop of the device. After forming the P-type body region, the deposited SiO$_2$ layer is removed to increase the contact area between metal and the polysilicon, thus reducing the thermal resistance. In addition, the accumulation of electrons below the polysilicon is promoted, further reducing the forward conduction voltage drop of the device. Furthermore, a P well photomask and a corresponding photoetching process can be omitted, and thus the cost is saved.

Figure 11:
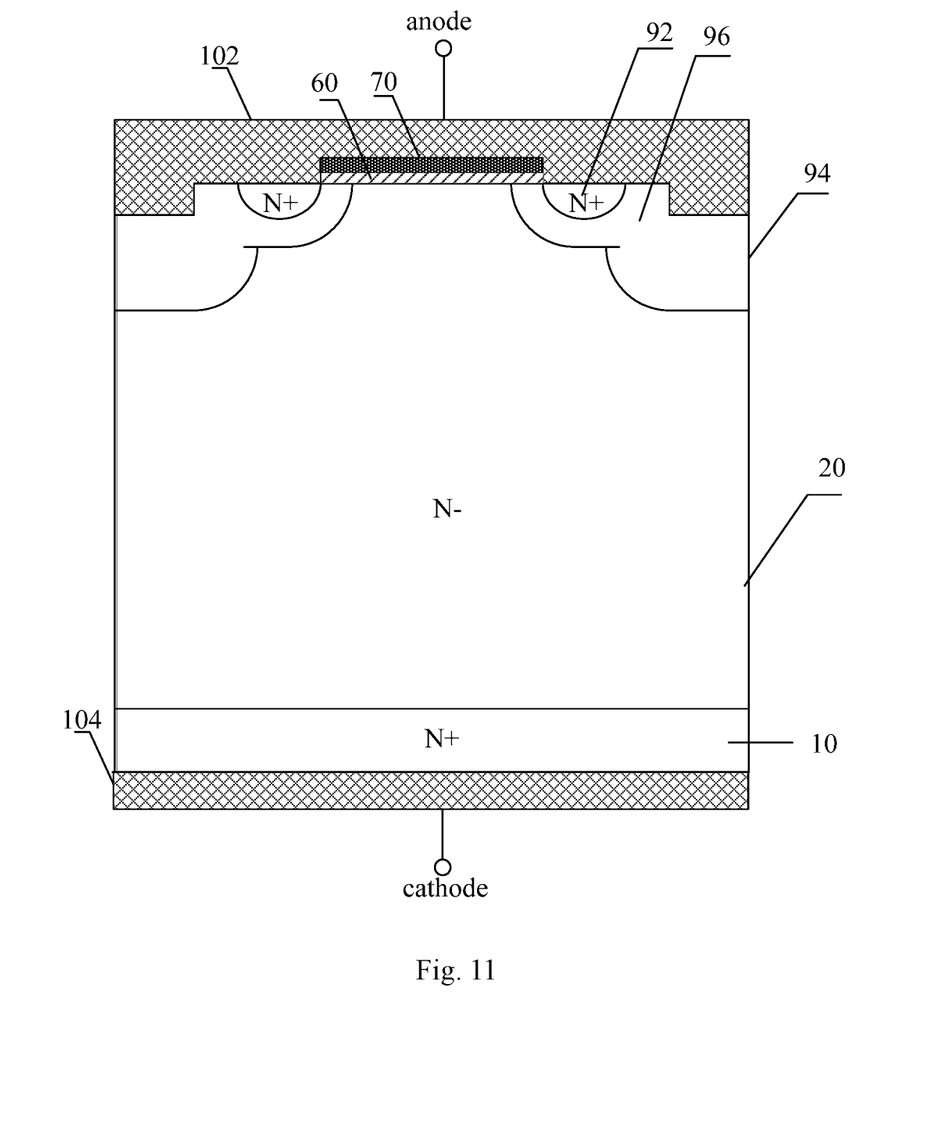
FIG. 11 is a cross-section view of the power diode manufactured by using the method of manufacturing the power diode in accordance with one embodiment.

FIG. 11 is a cross-section view of the power diode manufactured by using the method of manufacturing the power diode in accordance with the embodiment, including peripheral terminal structure (not shown in FIG. 11) and the active region surrounded by the terminal structure. The substrate of the power diode is the N-type substrate 10, the back side of the substrate 10 is provided with the back side metal wire layer 104. The front side of the substrate 10 is provided with the N-type epitaxial layer 20. The terminal guard ring (not shown in FIG. 11) is configured in the terminal structure. The front side of the epitaxial layer 20 of the active region is provided with the gate oxide layer 60, and the front side of the gate oxide layer 60 is provided with the polysilicon 70. The P-type body region 96 is configured in the epitaxial layer 20 of the active region, and the N-type heavily doped region 92 is configured in the P-type body region 96. The P+ region 94 is configured below the P-type body region 96. The front side of the whole device is provided with the front side metal wire layer 102.

Such power diode has good performance of low forward conduction voltage drop, short reverse recovery time, low leakage current and high reliability, and can be widely used in DC-DC converter, UPS continuous power supply, automotive electronics, portable electronics, motor drive system and other energy conversion device.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method of manufacturing a power diode, comprising the following steps:
   providing a substrate, and growing an N-type layer on a front side of the substrate;
   forming a terminal guard ring on a front side of the N-type layer;
   forming an oxide layer on a surface of the front side of the N-type layer, and performing a driving-in to the terminal guard ring;
   performing photoetching by using an active region photomask, and etching the oxide layer on an active region area; after removing a photoresist, forming a gate oxide layer on the front side of the N-type layer on the active region area, and depositing a polysilicon layer on the gate oxide layer;
   depositing a $SiO_2$ layer on a surface of the polysilicon layer and a surface of the oxide layer;
   performing photoetching by using a polysilicon photomask, etching the $SiO_2$ layer, and then etching the polysilicon layer; implanting N-type ions into the etched area through self-aligned implantation, and forming an N-type heavily doped region below the gate oxide layer;
   performing a gate oxide layer etching and a silicon etching by using the photoresist as a masking layer, implanting P-type ions below the etched area via ion implantation, and forming a P+ region;
   removing the photoresist, implanting P-type ions by using the $SiO_2$ layer as a masking layer, and forming a P-type body region;
   performing thermal annealing, and activating the implanted impurities;
   forming a side wall structure at an opening etched on the polysilicon layer and the gate oxide layer, and removing the $SiO_2$ layer; and
   performing a front side metallization processing and a back side metallization processing.

2. The method of manufacturing the power diode of claim 1, wherein in the performing photoetching by using the polysilicon photomask, etching the $SiO_2$ layer, and then etching the polysilicon layer; implanting the N-type ions into the etched area through self-aligned implantation, and forming the N-type heavily doped region below the gate oxide layer, the etching of the $SiO_2$ layer is isotropic etching, and the etching of the polysilicon layer is anisotropic etching.

3. The method of manufacturing the power diode of claim 1, wherein the forming the side wall structure at the opening etched on the polysilicon layer and the gate oxide layer, and removing the $SiO_2$ layer comprises: coating the photoresist on the front side of the wafer, forming the side wall structure at the opening etched on the polysilicon layer and the gate oxide layer through back etching, and then etching and removing the $SiO_2$ layer.

4. The method of manufacturing the power diode of claim 1, wherein the forming the terminal guard ring on the front side of the N-type layer comprises: forming a thin pad oxide layer on the surface of the front side of the N-type layer, performing photoetching by using a terminal guard ring photomask, implanting P-type ions into the N-type layer by using the photoresist as the masking layer, and forming a P-type terminal guard ring below the thin pad oxide layer.

5. The method of manufacturing the power diode of claim 1, wherein in the performing the gate oxide layer etching and the silicon etching by using the photoresist as the masking layer, implanting P-type ions below the etched area via ion implantation, and forming the P+ region, a thickness of the silicon removed by etching is 0.15 μm to 0.3 μm.

6. The method of manufacturing the power diode of claim 1, wherein in the performing photoetching by using the polysilicon photomask, etching the $SiO_2$ layer, and then etching the polysilicon layer; implanting the N-type ions into the etched area through self-aligned implantation, and forming the N-type heavily doped region below the gate oxide layer, the N-type ions are As ions; in the performing the gate oxide layer etching and the silicon etching by using the photoresist as the masking layer, implanting P-type ions below the etched area via ion implantation, and forming the P+ region, the P-type ions include boron ions and $BF_2$ ions; and in the removing the photoresist, implanting P-type ions by using the $SiO_2$ layer as a masking layer, and forming the P-type body region, the P-type ions are boron ions.

7. The method of manufacturing the power diode of claim 6, wherein in the performing photoetching by using the polysilicon photomask, etching the $SiO_2$ layer, and then etching the polysilicon layer; implanting the N-type ions into the etched area through self-aligned implantation, and forming the N-type heavily doped region below the gate oxide layer, an implantation energy of the As ions is 30 KeV to 50 KeV, and a sum of implantation dose of the As ions is $1 \times 10^{15}$ $cm^{-2}$ to $1 \times 10^{16}$ $cm^{-2}$; in the performing the gate oxide layer etching and the silicon etching by using the photoresist as the masking layer, implanting P-type ions below the etched area via ion implantation, and forming the P+ region, a sum of implantation dose of the boron ions is $1 \times 10^{13}$ $cm^{-2}$ to $5 \times 10^{13}$ $cm^{-2}$, and an implantation energy of the boron ions is 80 KeV to 100 KeV, while an implantation energy of the $BF_2$ ions is 20 KeV to 40 KeV, and a sum of implantation dose of the $BF_2$ ions is $6 \times 10^{14}$ $cm^{-2}$ to $1 \times 10^{15}$ $cm^{-2}$; and in the removing the photoresist, implanting P-type ions by using the $SiO_2$ layer as a masking layer, and forming the P-type body region, an implantation energy of the boron ions is 30 KeV to 50 KeV, and a sum of implantation dose of the boron ions is $1 \times 10^{13}$ $cm^{-2}$ to $5 \times 10^{13}$ $cm^{-2}$.

8. The method of manufacturing the power diode of claim 1, wherein in the performing the gate oxide layer etching and the silicon etching by using the photoresist as the masking layer, implanting P-type ions below the etched area via ion implantation, and forming the P+ region, the P-type ions are implanted in plural steps.

9. The method of manufacturing the power diode of claim 1, wherein the driving-in is performed in an oxygen-free environment at a temperature of less than or equal to 1100° C., and a driving-in time is 60 minutes to 200 minutes.

10. The method of manufacturing the power diode of claim 1, wherein in the depositing the $SiO_2$ layer on the surface of the polysilicon layer and the surface of the oxide layer, the depositing is a low voltage chemical vapor deposition using ethyl silicate as a reaction agent.

* * * * *